(12) United States Patent
Chen

(10) Patent No.: US 7,245,488 B2
(45) Date of Patent: Jul. 17, 2007

(54) FAN FASTEN DEVICE AND ELECTRICAL APPARATUS WITH THE SAME

(75) Inventor: Yi-Jen Chen, Lujhou (TW)

(73) Assignee: ASUSTek Computer Inc., Taipei (TW)

( * ) Notice: Subject to any disclaimer, the term of this patent is extended or adjusted under 35 U.S.C. 154(b) by 270 days.

(21) Appl. No.: 11/001,039

(22) Filed: Dec. 2, 2004

(65) Prior Publication Data
US 2005/0168944 A1    Aug. 4, 2005

(30) Foreign Application Priority Data
Jan. 29, 2004    (TW)    ............................... 93102061 A

(51) Int. Cl.
*H05K 7/20*    (2006.01)
*F04D 29/64*    (2006.01)

(52) U.S. Cl. .................... 361/695; 361/719; 415/213.1

(58) Field of Classification Search ..................... None
See application file for complete search history.

(56) References Cited

U.S. PATENT DOCUMENTS

| | | | |
|---|---|---|---|
| 5,371,652 A * | 12/1994 | Clemens et al. ............ | 361/704 |
| 5,498,130 A * | 3/1996 | Wakley et al. ............ | 415/213.1 |
| 5,521,439 A * | 5/1996 | Casati et al. ................ | 257/718 |
| 5,734,556 A | 3/1998 | Saneinejad et al. | |
| 5,969,941 A * | 10/1999 | Cho ........................... | 361/687 |
| 6,236,564 B1* | 5/2001 | Fan ............................. | 361/695 |
| 6,244,953 B1* | 6/2001 | Dugan et al. ............... | 454/184 |
| 6,351,380 B1* | 2/2002 | Curlee et al. ............... | 361/695 |
| 6,353,537 B2* | 3/2002 | Egawa ........................ | 361/704 |
| 6,711,019 B2* | 3/2004 | Manabe et al. ............. | 361/704 |
| 6,947,281 B2* | 9/2005 | Wrycraft et al. ............ | 361/695 |
| 7,002,796 B2* | 2/2006 | Lao et al. .................... | 361/695 |
| 2003/0058621 A1* | 3/2003 | Wells ......................... | 361/719 |
| 2004/0184234 A1* | 9/2004 | Kosugi ........................ | 361/695 |
| 2005/0122683 A1* | 6/2005 | Tung ........................... | 361/695 |
| 2005/0195573 A1* | 9/2005 | Huang ........................ | 361/709 |
| 2005/0264999 A1* | 12/2005 | Kalyandurg ................ | 361/704 |

* cited by examiner

*Primary Examiner*—Boris Chérvinsky
(74) *Attorney, Agent, or Firm*—Birch, Stewart, Kolasch & Birch, LLP

(57) ABSTRACT

A fan fasten device is for fixing at least one fan. The fan fasten device includes a chassis and a fastener. At least one fixing portion is set on the chassis, and at least one end of the fastener is connected with the fixing portion.

16 Claims, 6 Drawing Sheets

FAN FASTEN DEVICE AND ELECTRICAL APPARATUS WITH THE SAME

CROSS REFERENCE TO RELATED APPLICATIONS

This Non-provisional application claims priority under 35 U.S.C. § 119(a) on Patent Application No. 093102061 filed in Taiwan, Republic of China on Jan. 29, 2004, the entire contents of which are hereby incorporated by reference.

BACKGROUND OF THE INVENTION

1. Field of Invention

The invention relates to a fan fasten device and an electrical apparatus and, in particular, to a fan fasten device and an electrical apparatus, which are facilitated to install and/or to remove a fan.

2. Related Art

The technology of integrated circuit manufacturing processes has developed for a long time, so that the electrical devices with faster processing speed are manufactured according to the progressed technology. As a result, a sufficient amount of heat is generated accompanying with the electrical device, which is in a high-speed operation. If the generated heat cannot be dissipated properly, the temperature of the internal electrical device will increase. Accordingly, the stability of the electrical device is interfered, and, more particularly, the electrical device may break down.

The data processing apparatus, such as a computer host, is usually composed of many electrical devices. In conventional, to ensure the computer host of normal functions, a fan is installed on the casing of the computer. Thus, the fan can induce air convection to dissipate heat inside the working computer. Accordingly, the high temperature environment caused by the high-speed operated computer host can be reduced, so as to maintain the performance and stability of the computer host.

In the conventional assembling method, the fan can be attached to the casing of the computer by screws or an additional frame. As shown in FIG. 1, a device is screwed on the computer host and includes a plurality of fans 11 and a chassis 12. Herein, the fans 11 are fixed to the chassis 12 with a plurality of screws 13, which are disposed through the through holes 111 to the corresponding screw holes 121. In addition, a plurality of screws 13' are disposed through the corresponding through holes 121' of the chassis 12 to fix the chassis 12 to a computer casing.

Regarding to the conventional fan assembling structure, if the fan 11 breaks down, the screws 13' for attaching the chassis 12 to the computer casing must be firstly removed, and then the screws 13 for attaching the fans 11 to the chassis 12 are removed. After these procedures, the malfunctioned fan can be replaced with a normal one. Accordingly, the normal fan is attached to the chassis 12 with the screws 13, and the chassis 12 is then installed to the computer casing. However, the previously mentioned assembling method requires screws and a screwdriver to perform these procedures. As known by those skilled persons, the conventional method wastes time and manpower.

With reference to FIG. 2, another method for fixing the fans to the chassis utilizes a frame. The frame 14 has an accommodating area for accommodating and fixing a plurality of fans 11. The frame 14 further has a hook structure 141, which is used to connect to a wedged structure 122 of the chassis 12. When the hook structure 141 is locked to the wedged structure 122, the frame 14 is fixed on the chassis 12. Finally, a plurality of screws 13 is embedded into the corresponding screw holes 121 so as to fix the chassis 12 on the computer casing. It requires many steps to fix the fans 11 onto the computer casing. Similarly, for removing the fans 11 fixed with the frame 14, screws and screwdriver are necessary to take the chassis 12 off the computer casing. After that, the frame 14 is unlocked from the wedged structure 122 of the chassis 12, and the fans 11 can then be got out. Furthermore, it takes extra costs to manufacture the frame 14. Therefore, both of the above mentioned methods for fastening the fans on the computer casing take manpower, time, and cost.

It is therefore a subjective of the invention to provide a novel fan fasten device and electrical apparatus with the fan fasten device, which can solve the above mentioned problems for the computer assembling and service industries.

SUMMARY OF THE INVENTION

In view of the foregoing, the invention is to provide a fan fasten device, which is facilitated to be installed and removed, and to provide an electrical apparatus, which has fans that can be manually fastened to or removed from the casing without any assistant tool.

To achieve the above, a fan fasten device of the invention is for fixing at least one fan and includes a chassis and a fastener. In the invention, at least one fixing portion is set on the chassis, and the fastener has at least one end connected with the fixing portion.

In addition, the invention further discloses an electrical apparatus, which includes a circuit board, a chassis, at least one fan and a fastener. In this casing, at least one fixing portion is set on the chassis, and at least one fan is disposed on the chassis and connected to the circuit board. The fastener has at least one end connected with the fixing portion.

As mentioned above, the invention only has to punch the casing to form a fixing portion in proper, and fastens the fan(s) on the casing next to the fixing portion. In this casing, a simple structure fastener is designed for connecting with the fixing portion so as to fix the fan(s) on the casing. According to the invention, the processes of installing and removing the fans are very facile to be carried out. Therefore, the manpower and time for installing or removing the fans can be efficiently decreased. In addition, it is also facilitated for the manufacturer and service provider to manufacture, install fans to, and remove fans from the apparatus. Accordingly, the assembling cost can be greatly reduced.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
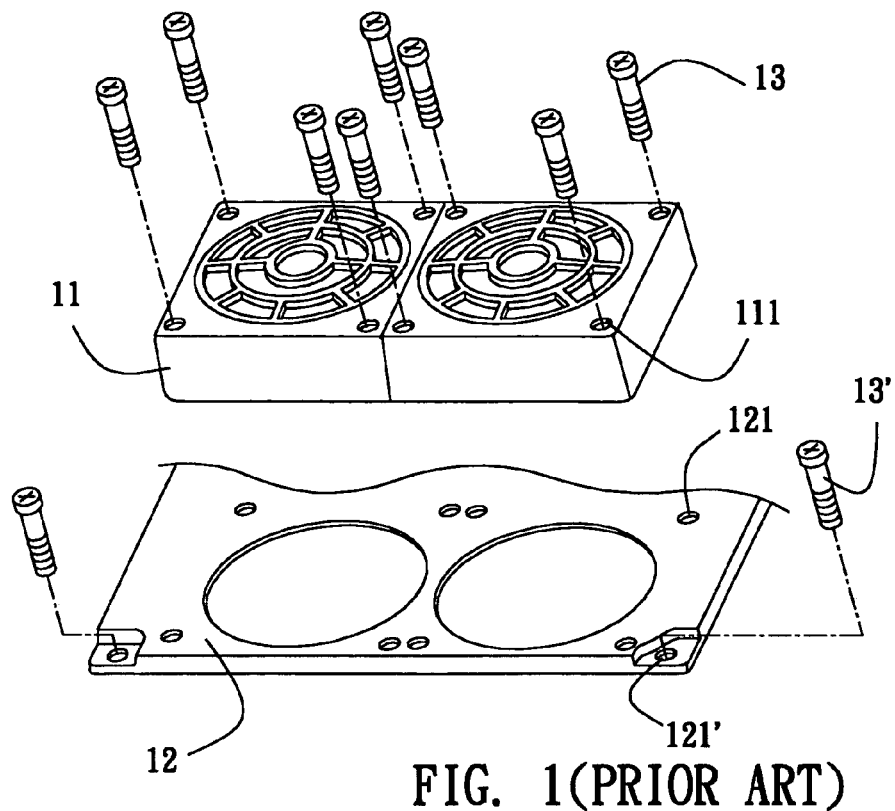
FIG. 1 is a schematic view showing a conventional fan fasten device.
Figure 2:
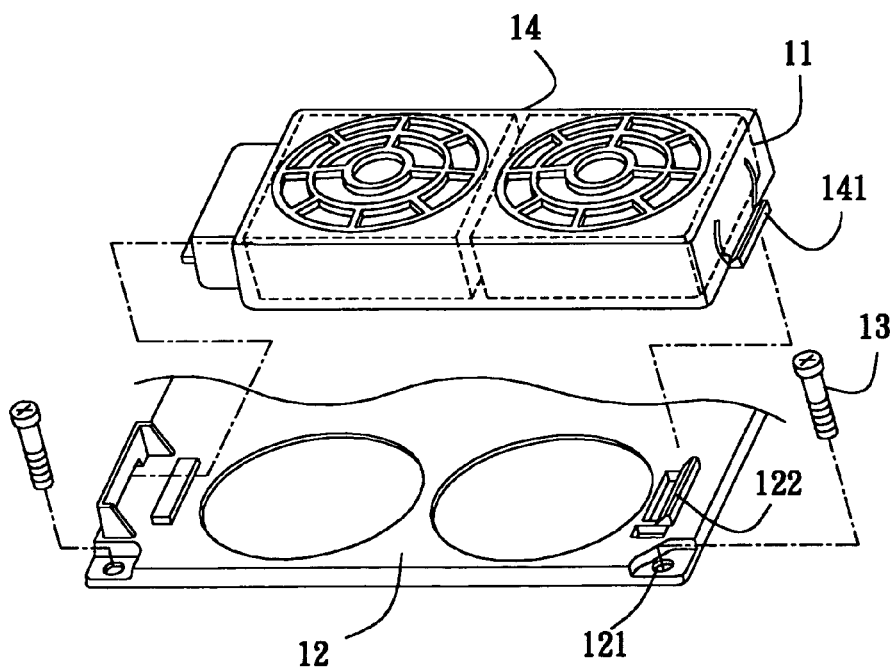
FIG. 2 is schematic view showing another conventional fan fasten device.
Figure 3:
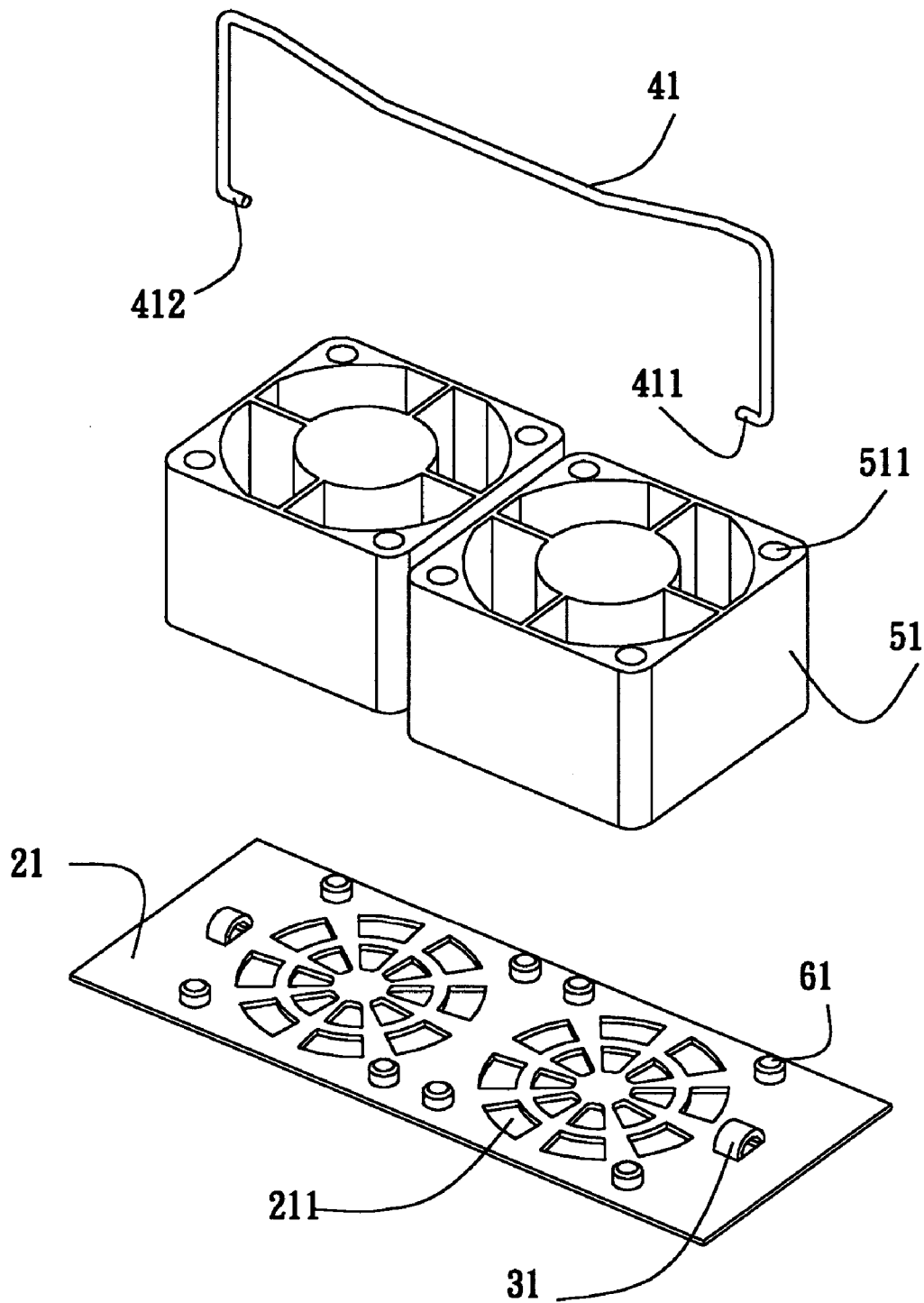
FIG. 3 is an explode diagram showing a fan fasten device according to a preferred embodiment of the invention.

With reference to FIG. 3, a fan fasten device 2 according to a preferred embodiment of the invention is used to fix at least one fan 51 and comprises a chassis and a fastener. In the invention, the fan 51 is fixed to the chassis 21 by utilizing the fastener 41.

The chassis 21 is a casing or is fixed to a casing. In this embodiment, the chassis 21 is a casing and, in particular, is a computer casing. The chassis 21 has at least one vent 211.

Figure 7:
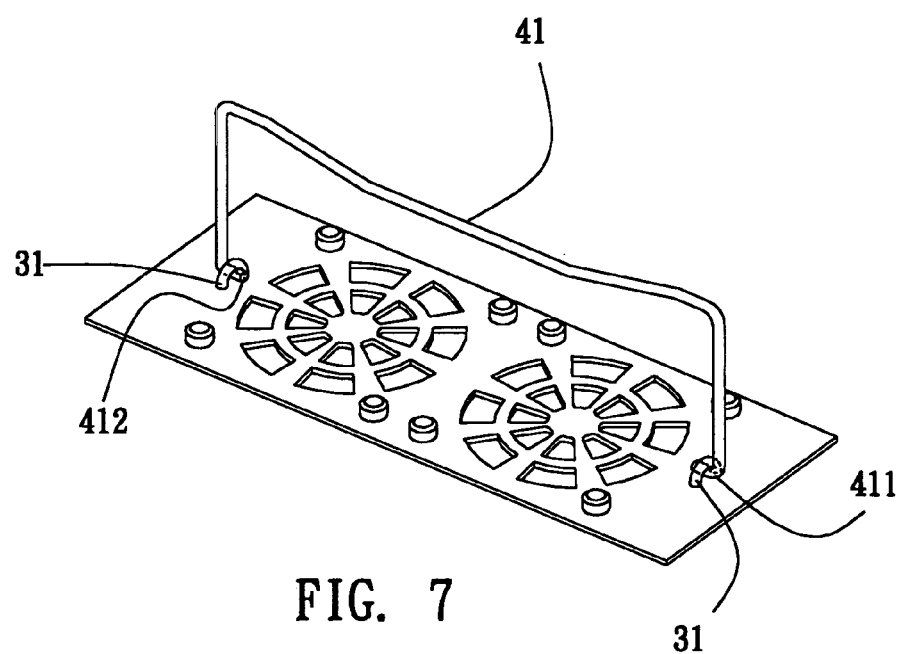
FIG. 7 is a schematic view showing another fan fasten device according to the embodiment of the invention.
Figure 8:
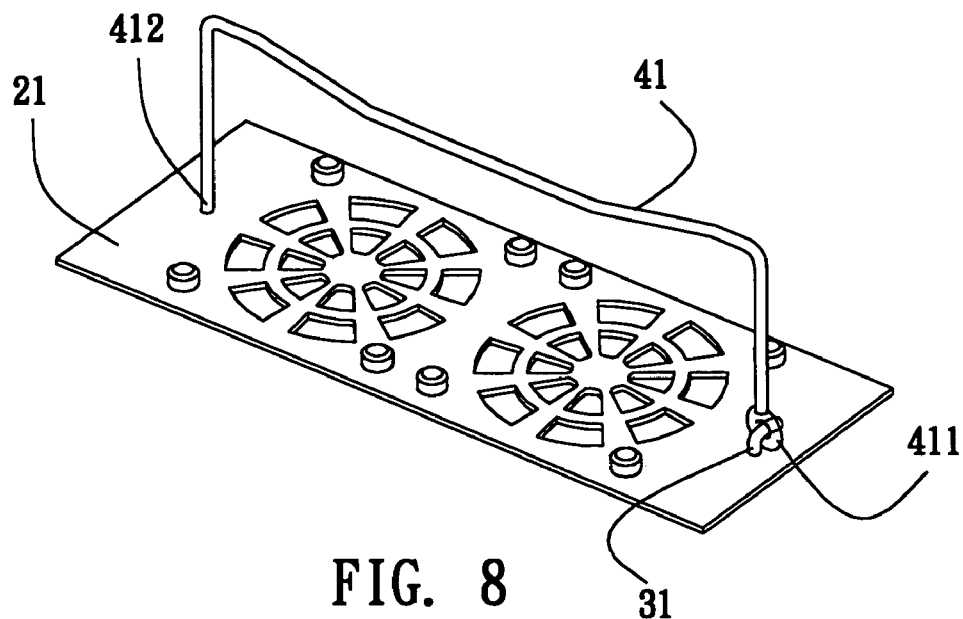
FIG. 8 is a schematic view showing yet another fan fasten device according to the embodiment of the invention.
Figure 9:
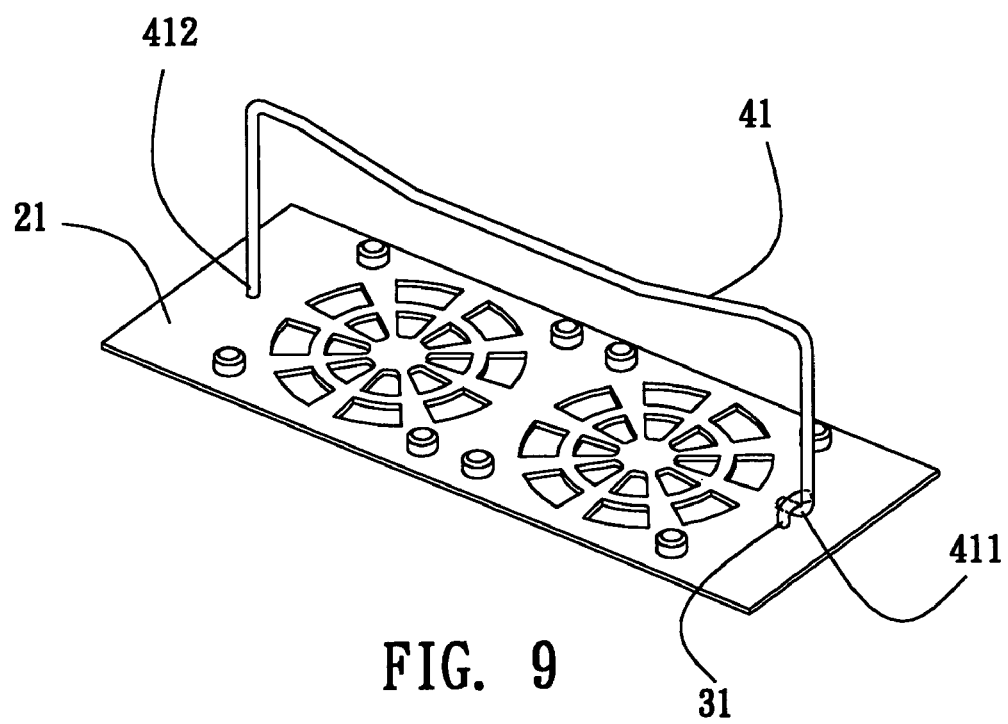
FIG. 9 is a schematic view showing still another fan fasten device according to the embodiment of the invention.

As shown in FIG. 3, a fixing portion 31 is formed on the chassis 21 by a punch process. The fixing portion 31 can be a slot, a buckling ring (as shown in FIG. 7), or a wedging hook (as shown in FIG. 8). In the present embodiment, the fixing portion 31 and the chassis 21 are integrally formed. Certainly, the fixing portion 31 can be a singular element and is installed on the chassis 21.

Referring to FIG. 3, the fastener 41 has a first end 411 and a second end 412, wherein positions of the first end 411 and the second end 412 can be switched with one another. The first end 411 and the second end 412 are respectively connected with the corresponding fixing portions 31. In this casing, the first end 411 and the second end 412 are respectively buckled with the corresponding fixing portions 31. As shown in FIG. 8, of course, the first end 411 is connected with the fixing portion 31, and the second end 412 is fixed to the chassis 21. In such a casing, the second end 412 is screwed on the fixing portion 31. The fastener 41 is stripe-shaped. In addition, the fastener 41 can be a springy slice, or a fixing frame.

The fastener 41 connects to a wedging structure, which is an embodiment of the invention. As shown in FIG. 3, the fixing portion 31 is a locking notch as well as the first end 411 and second end 412 are wedging hooks. Alternatively, the fixing portion 31 is a buckling ring as well as the first end 411 and second end 412 are wedging hooks. As shown in FIG. 8, the fixing portion 31 is a wedging hook, and the first end 411 is a buckling ring. Herein, the fastener 41 is springy.

With reference to FIG. 3, a fan fasten device 2 further includes a plurality of first locating portions 61, which are positioned on the chassis 21. Correspondingly, a plurality of second locating portions 511 are disposed on the fan 51 and for fitting the first locating portions 61 respectively. In the present embodiment, the first locating portions 61 are locating protrusions formed on the chassis 21 by punch processes, and the second locating portions 511 are locating holes of the fan 51. The first locating portions 61 are inserted into corresponding second locating portions 511 of the fan 51, respectively. Of course, the first locating portions can be locating holes and the second locating portions can be locating protrusions, so that the first and second locating portions can fit to each other perfectly.

Figure 4:
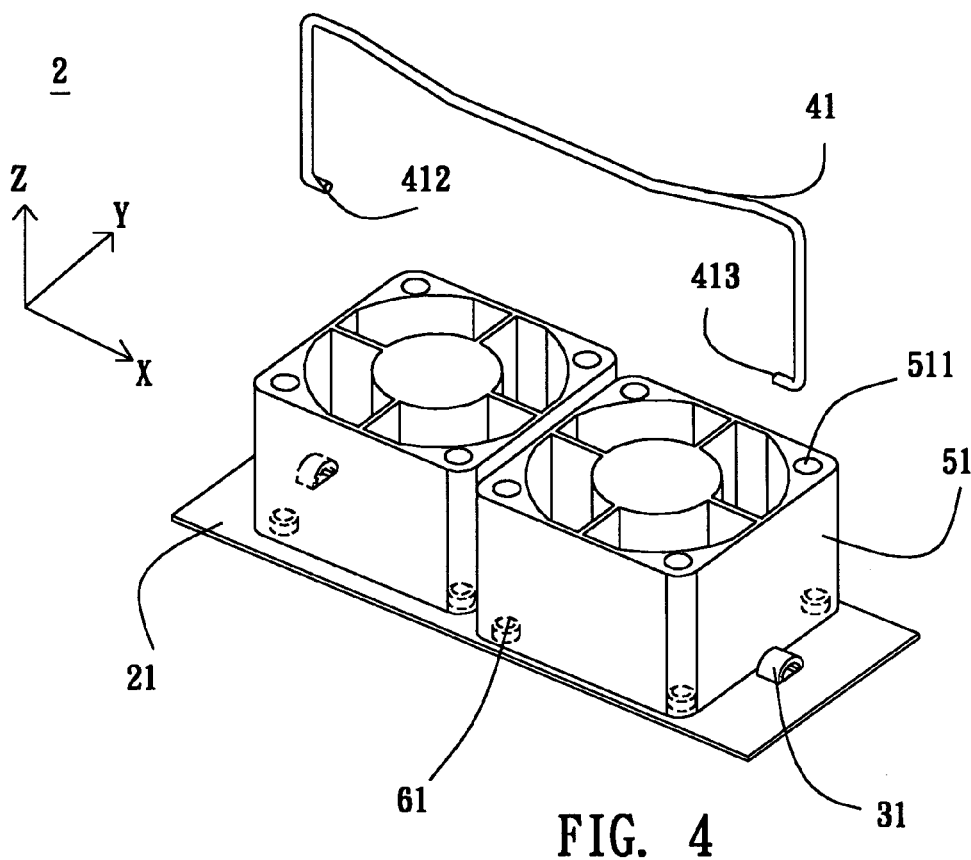
FIG. 4 is an assembling diagram showing a portion of the fan fasten device according to the embodiment of the invention.
Figure 5:
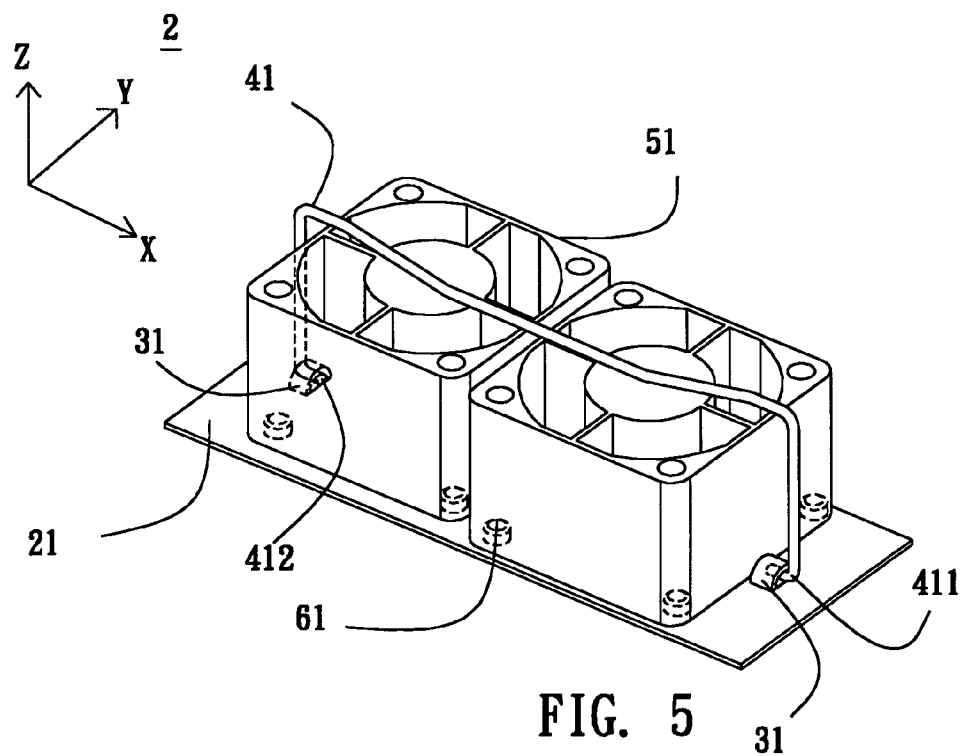
FIG. 5 is an assembling diagram showing the fan fasten device according to the embodiment of the invention.
Figure 6:
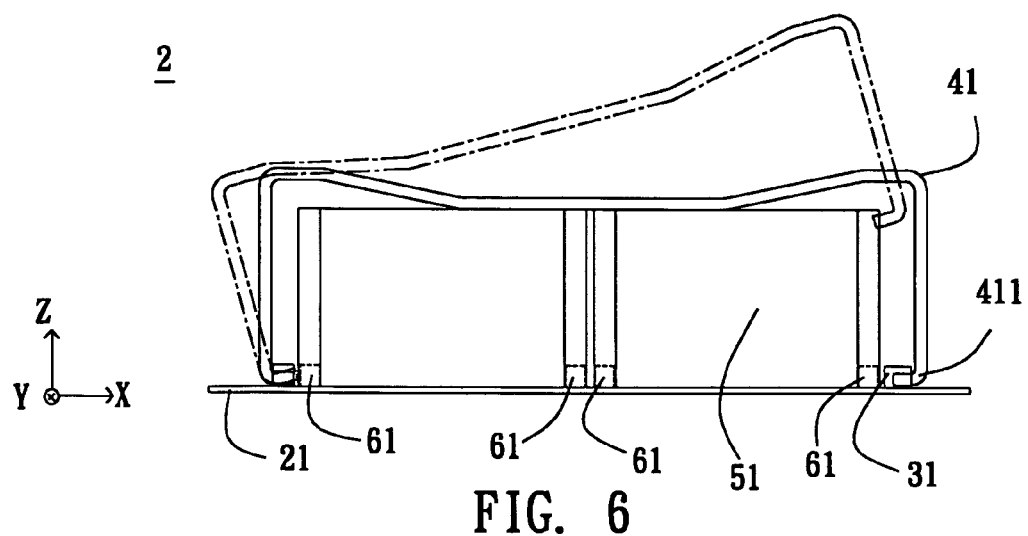
FIG. 6 is an assembling diagram showing the assembling procedure of the fan fasten device according to the embodiment of the invention.

With reference to FIG. 4, an operator firstly places at least one fan 51 on the chassis 21, wherein each first locating portion 61 is wedged to a corresponding second locating portion 511 of the fan 51. Accordingly, the fan 51 can be positioned at the exactly place on the chassis 21 on both X and Y directions. If the design is proper, the fixing portions 31 are located at the edges of two opposite sides of the fan 51. Referring to FIG. 5, the second end 412 of the fastener 41 is connected to the corresponding fixing portion 31, and the fastener 41 is then installed along the surface structure of the fan 51. Finally, the first end 411 is correspondingly connected to another fixing portion 31. Since the fastener 41 is springy, the fan 51 can be fixed on the chassis 21 according to the compression feature of the fastener 41. As this manner, the fan 51 can be positioned at the exactly place on the chassis 21 on Z direction.

With reference to 6, to release the fan 51 from the chassis on Z direction, the operator only pulls the first end 411 of the fastener 41. Therefore, the first end 411 is separated from the corresponding fixing portion 31, and the fastener 41 is then removed. After that, to release the fan 51 from the chassis on X and Y directions, the operator only takes the fan 51 upwardly to separate the second locating portions 511 of the fan from the first locating portions 61. Accordingly, the uninstalling procedure for removing the fan is completed.

Figure 10:
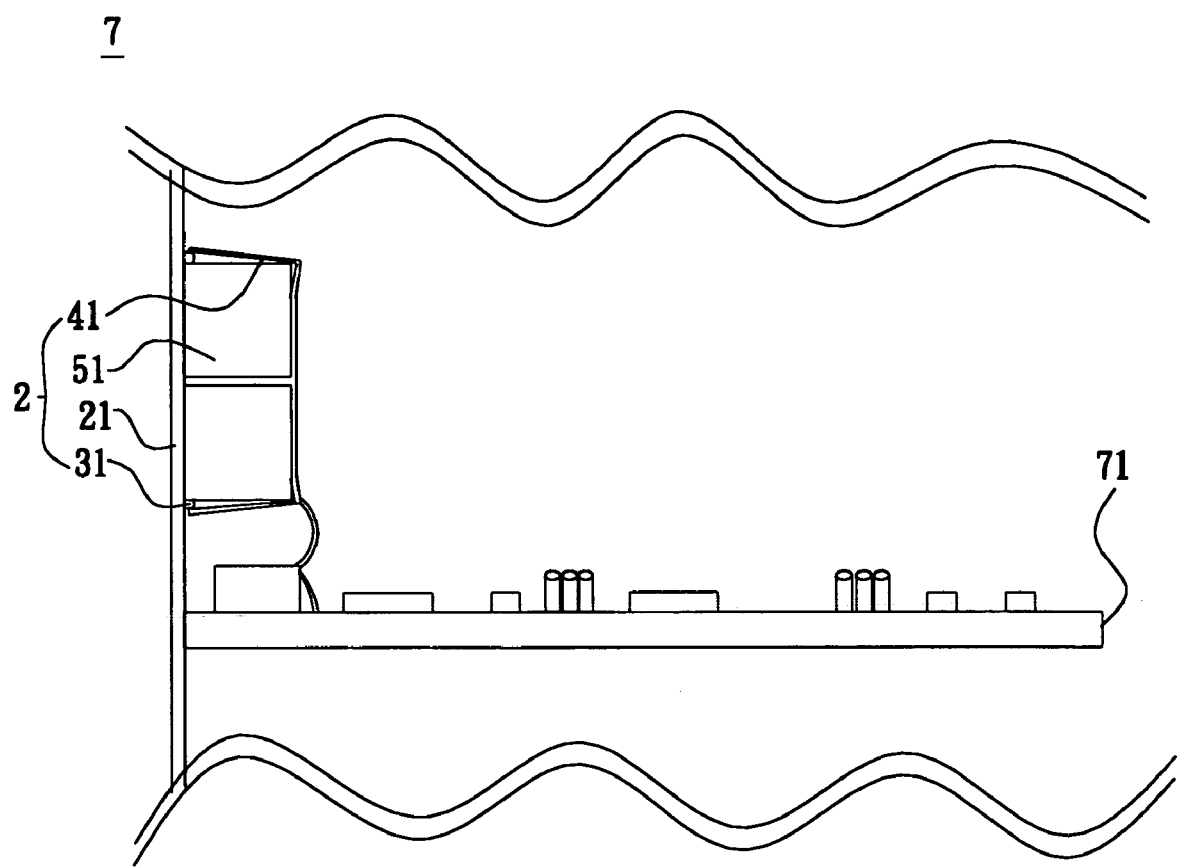
FIG. 10 is a schematic side view showing an electrical apparatus according to an embodiment of the invention.

In addition, as shown in FIG. 10, an electrical apparatus 7 according to a preferred embodiment of the invention includes a circuit board 71, a chassis 21, at least one fan 51, and a fastener 41. In the embodiment, at least one fixing portion is located on the chassis 21. The fan 51 is disposed on the chassis 21 and connected to the circuit board 71. At least one end of the fastener 41 is connected to the fixing portion 31.

Herein, the structures of the chassis 21 and the fastener 41 is the same as those described in the previously mentioned embodiment, and the procedure for assembling the fan is the same as that described in the previously mentioned embodiment, so that the detailed descriptions are omitted in concise purpose.

As mentioned above, only a fixing portion, which is formed at a proper position by a punch procedure, and a simple structure fastener are required in the invention. By utilizing the connection between the fastener and the fixing portion, the fan(s) can be installed to or removed from the chassis easily.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A fan fasten device for fixing at least one fan, comprising:
   a chassis having at least one fixing portion; and
   a fastener having a first end and a second end, wherein the second end and the chassis are irremovably assembled together, the first end is connected with the fixing portion to fix the fan on the chassis.

2. The fan fasten device of claim 1, wherein the chassis is a casing.

3. The fan fasten device of claim 1, wherein the chassis is fixed on a casing.

4. The fan fasten device of claim 1, wherein the first end of the fastener is buckled with the fixing portion.

5. The fan fasten device of claim 1, wherein the fixing portion is a wedging hook, and the first end of the fastener is a locking notch.

6. The fan fasten device of claim 1, wherein the fixing portion is a locking notch, and the first end of the fastener is a wedging hook.

7. The fan fasten device of claim 1, further comprising:
   a plurality of first locating portions disposed on the chassis; and
   a plurality of second locating portions disposed on the fan and fitting the first locating portions respectively.

8. The fan fasten device of claim 1, wherein the fastener is a springy stripe means.

9. An electrical apparatus, comprising:
   a circuit board;
   a chassis having at least one fixing portion;
   at least one fan disposed on the chassis and electrically connected to the circuit board; and
   a fastener having a first end and a second end, wherein the second end and the chassis are irremovably assembled together, the first end is connected with the fixing portion to fix the fan on the chassis.

10. The electrical apparatus of claim 9, wherein the chassis is a casing.

11. The electrical apparatus of claim 9, wherein the chassis is fixed on a casing.

12. The electrical apparatus of claim 9, wherein the first end of the fastener is buckled with the fixing portion.

13. The electrical apparatus of claim 9, wherein the fixing portion is a wedging hook, and the first end of the fastener is a locking notch.

14. The electrical apparatus of claim 9, wherein the fixing portion is a locking notch, and the first end of the fastener is a wedging hook.

15. The electrical apparatus of claim 9, further comprising:
   a plurality of first locating portions disposed on the chassis; and
   a plurality of second locating portions disposed on the fan and fitting the first locating portions respectively.

16. The electrical apparatus of claim 9, wherein the fastener is a springy stripe means.

* * * * *